United States Patent [19]
Czaja et al.

[11] Patent Number: 4,732,173
[45] Date of Patent: Mar. 22, 1988

[54] VERTICAL PHOTORESIST DEVELOPER

[75] Inventors: James J. Czaja; John J. Herrmann, both of Maple Plain, Minn.

[73] Assignee: Circuit Chemistry Corporation, Maple Plain, Minn.

[21] Appl. No.: 796,933

[22] Filed: Dec. 20, 1985

[51] Int. Cl.$^4$ ............................................. B08B 3/02
[52] U.S. Cl. ..................................... 134/72; 134/131; 134/199
[58] Field of Search .................... 134/61, 72, 82, 95, 134/99, 102, 105, 113, 131, 133, 199

[56] References Cited

U.S. PATENT DOCUMENTS

| | | | |
|---|---|---|---|
| 2,671,241 | 3/1954 | Starner | 134/72 X |
| 3,076,730 | 2/1963 | Nolte | 134/72 X |
| 3,593,640 | 7/1971 | Gall | 134/82 X |
| 3,694,847 | 10/1972 | Hetman et al. | 134/64 R X |
| 3,849,831 | 11/1974 | De Verter | 134/72 X |
| 4,208,760 | 6/1980 | Dexter | 134/133 X |
| 4,281,675 | 8/1981 | Pure | 134/72 X |
| 4,351,266 | 9/1982 | Ando et al. | 134/82 X |
| 4,452,264 | 6/1984 | Kreisel et al. | 134/199 X |
| 4,506,687 | 3/1985 | Rosch, III | 134/64 R X |
| 4,539,069 | 9/1985 | Fishman et al. | 134/72 X |
| 4,561,904 | 12/1985 | Eberhardt | 134/57 D X |

FOREIGN PATENT DOCUMENTS

1115250 9/1986 U.S.S.R. ............................... 134/61

Primary Examiner—Harvey C. Hornsby
Assistant Examiner—Frankie L. Stinson
Attorney, Agent, or Firm—Hugh D. Jaeger

[57] ABSTRACT

Vertical photoresist developer for processing of any size of printed circuit boards carried on a processing cassette. The processing cassette is carried by a chain through a main chamber, a rinse chamber and a drying chamber, all the processing chambers in line with each other. The processing system is electromechanical and electrically controlled, as well as air and liquid flow control. The developer is system oriented and symmetrical in operation to either side of the board.

10 Claims, 9 Drawing Figures

VERTICAL PHOTORESIST DEVELOPER

BACKGROUND OF THE INVENTION

1. Field of the Invention

The present invention is a chemical conveyorized processor system for printed circuit boards, and more importantly, pertains to a vertical photoresist developer for printed circuit boards. The system can also function as a vertical solder stripper, photoresist stripper or a vertical etcher for printed circuit boards.

2. Description of the Prior Art

Prior art developer systems for printed circuit boards have not been able to process any size of printed circuit boards on the same piece of equipment. Finally, prior art systems have not always provided for consistent uniform processing of printed circuit boards. Prior art has also suffered from premature wear on the board transport system because of the materials used.

The present invention overcomes the disadvantages of the prior art by providing a system for processing of printed circuit boards.

SUMMARY OF THE INVENTION

The general purpose of the present invention is to provide a non-immersion vertical photoresist developer for the chemical processing of printed circuit boards utilizing a controlled and automatic process where a circuit board passes vertically through a plurality of processing chambers. Another purpose of the present invention is a processing system for uniformly processing of printed circuit boards in a system including uniform fluid flow control.

According to embodiments of the present invention, there is provided a motor driven variable speed conveyor chain which engages formed teeth of an open-center circuit board processing cassette. A printed circuit board fits into the vertical basket open-center vertically aligned cassette and is carried through a series of sealed chambers by a driven chain. After placing the cassette onto a loading slot, the cassette moves into a developer wash chamber. Substantially similar mirror-image dual-spray nozzles vertically aligned spray tubes on each side of the chain conveyor truck spray processing solution about both sides of the printed circuit board. In a rinse chamber a rinse solution is applied to both sides of the printed circuit board by substantially similar mirror-image vertically-aligned spray tubes with a plurality of spray nozzles, as well as an overhead spray nozzle for complete and thorough rinsing in the sealed rinse compartment. The printed circuit board is dried by high pressure air knives in the drying chamber before moving into the unload slot. Processing spray fluid is temperature controlled and the motor is variable speed for length of exposure of the printed circuit board through the chambers. Automatic interlocks and emergency stop controls provide for safety of the operator and to the process equipment. Flow control of the fluid is electromechanically and fluid dynamically controlled.

One significant aspect and feature of the present invention is printed circuit board conveyorized processor system.

Another significant aspect and feature of the present invention is a vertical photoresist developer using vertical alignment of the printed circuit board in the processor.

Another significant aspect and feature of the present invention is a vertical photoresist developer using a variable-speed chain conveyor for engaging a printed circuit board in a cassette engaged on a processing carry through chain. This enables small parts to be processed through the machine, yet the chain conveyor has little or no wear characteristics. The system can also pass small parts through the machine.

A further significant aspect and feature of the present invention is a vertical photoresist developer utilizing substantially vertically aligned spray tubes in the develop/wash chambers and rinse chambers, as well as a plurality of overhead rinse spray tubes.

Yet, another significant aspect and feature of the present invention is a vertical photoresist developer using high pressure air knives to substantially dry the circuit boards.

Still another significant aspect and feature of the present invention is a vertical photoresist developer which utilizes multiple-membered chamber divider seals to divide the processing chambers from one another.

Yet, still, another significant aspect and feature of the present invention is a vertical photoresist developer utilizing substantially all non-corrosive plastic members for its construction.

Further, another significant aspect and feature of the present invention is a vertical photoresist developer utilizing drop-in style cassette for the carrying of any size of printed circuit board, but especially small ones, for processing through each of the chambers.

Having thus described embodiments of the present invention, it is one principal object hereof to provide a vertical photoresist developer that is automatic in operation which carries a printed circuit board in a cassette vertically and automatically through chemical processing chambers.

Another object of the present invention is a processing system for processing any size printed circuit board by a variety of chemicals.

A further object of the present invention is a printed circuit board processing system which provides for electromechanical and flow control of fluids including chemical fluids and air flow for drying.

BRIEF DESCRIPTION OF THE DRAWINGS

Other objects and many of the attendant advantages of this invention will be readily appreciated as the same becomes better understood by reference to the following detailed description when considered in connection with the accompanying drawings, in which like reference numerals designate like parts throughout the figures thereof and wherein.

DESCRIPTION OF THE PREFERRED EMBODIMENTS

Figure 1:
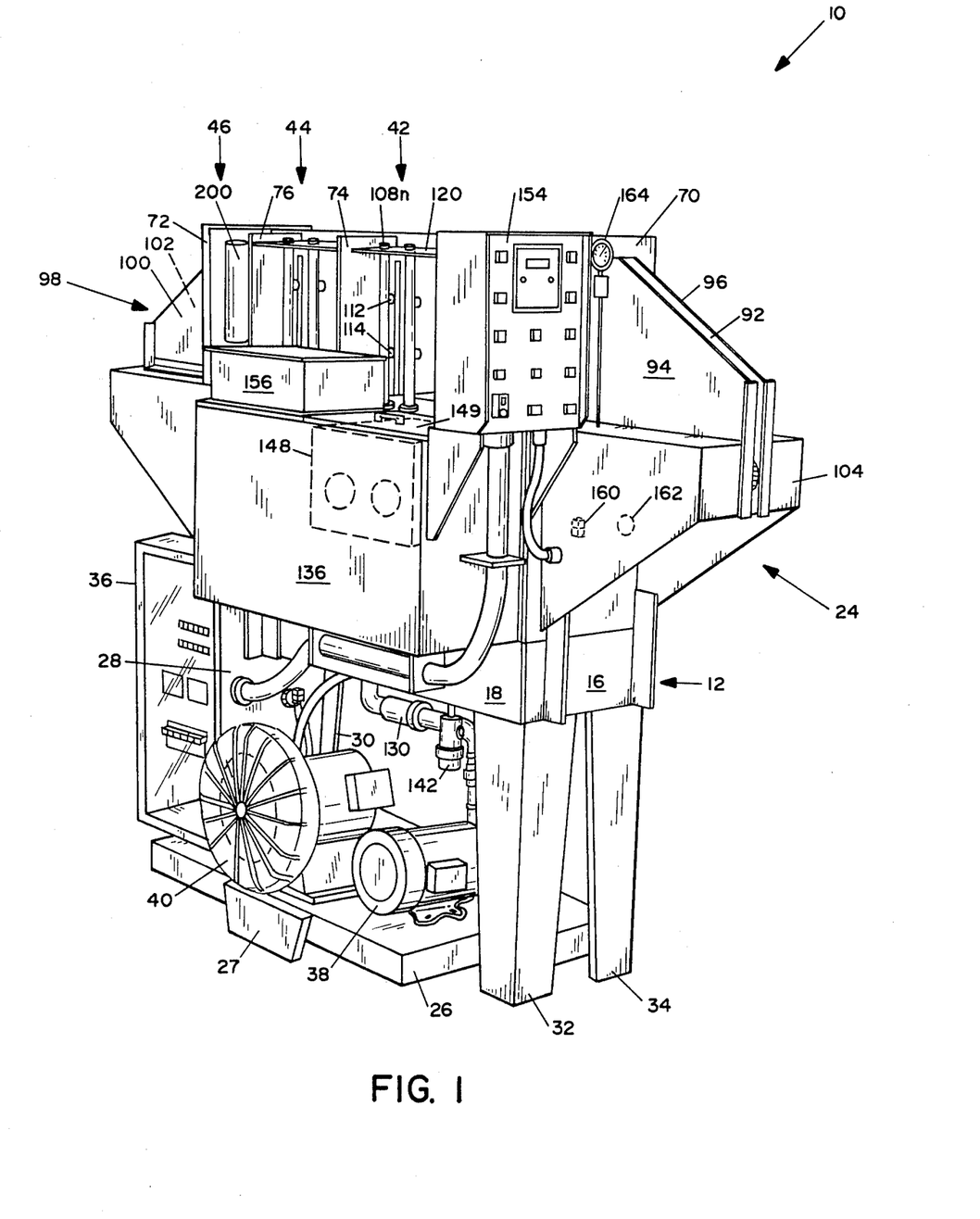
FIG. 1 illustrates a perspective view showing the left and front sides of a vertical photoresist developer the present invention.
Figure 2:
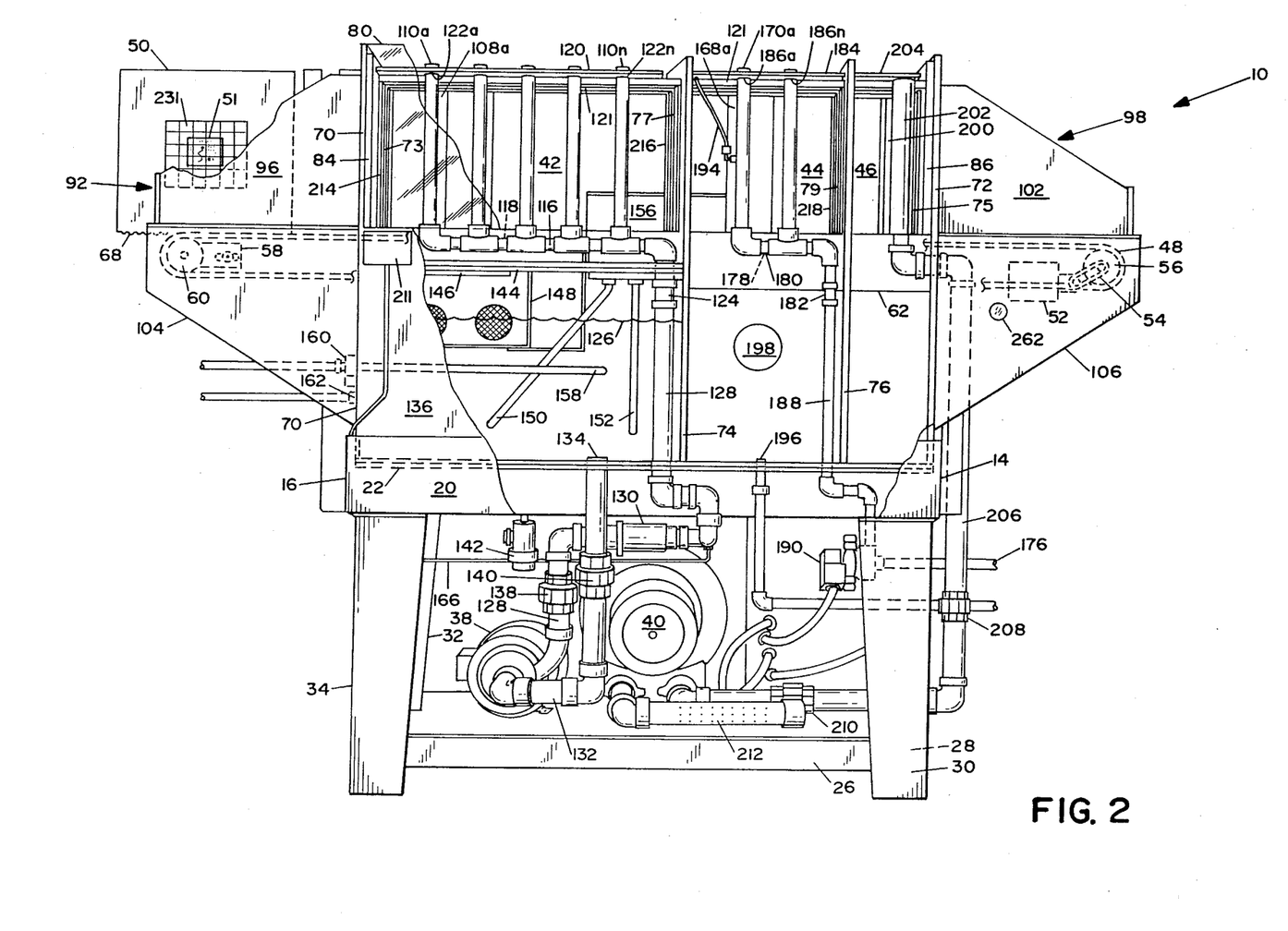
FIG. 2 illustrates a right side view of the vertical photoresist developer.
Figure 3:
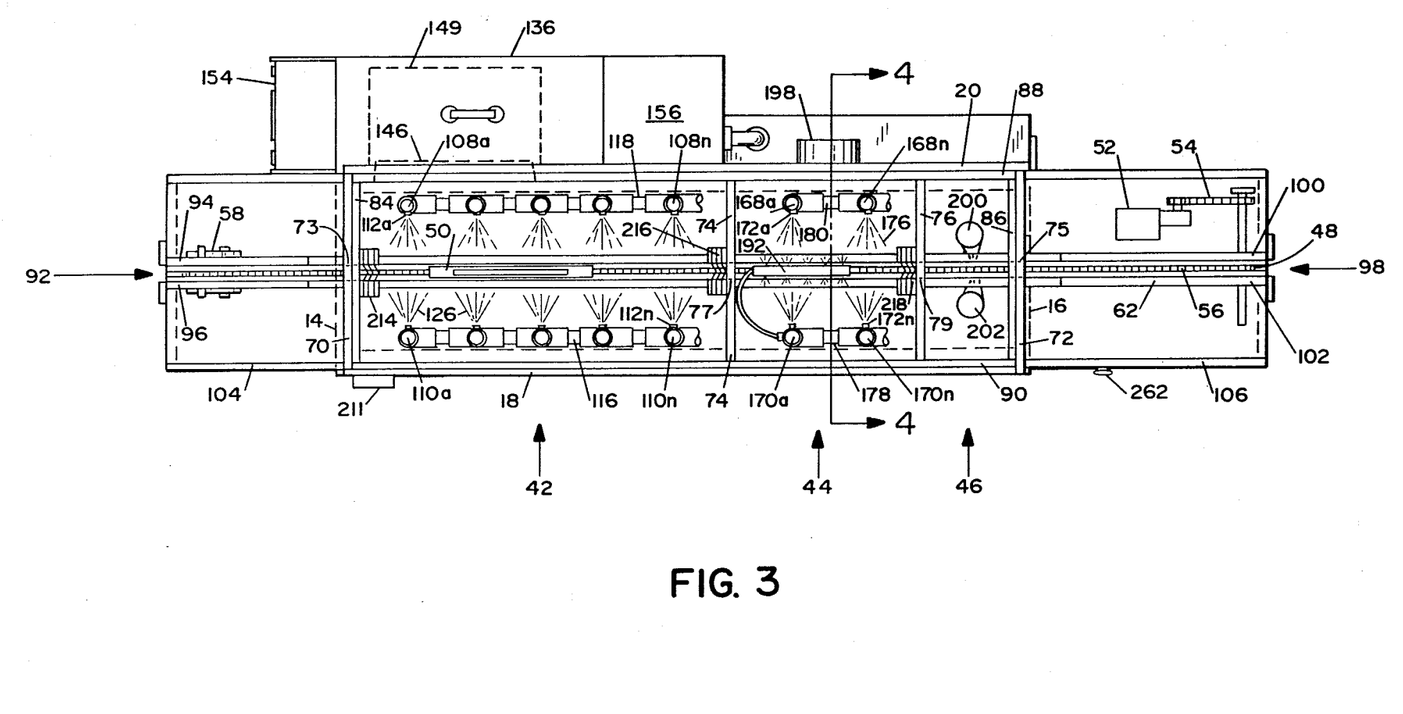
FIG. 3 illustrates a top view of the vertical photoresist developer with top tube supports and cover removed.
Figure 4:
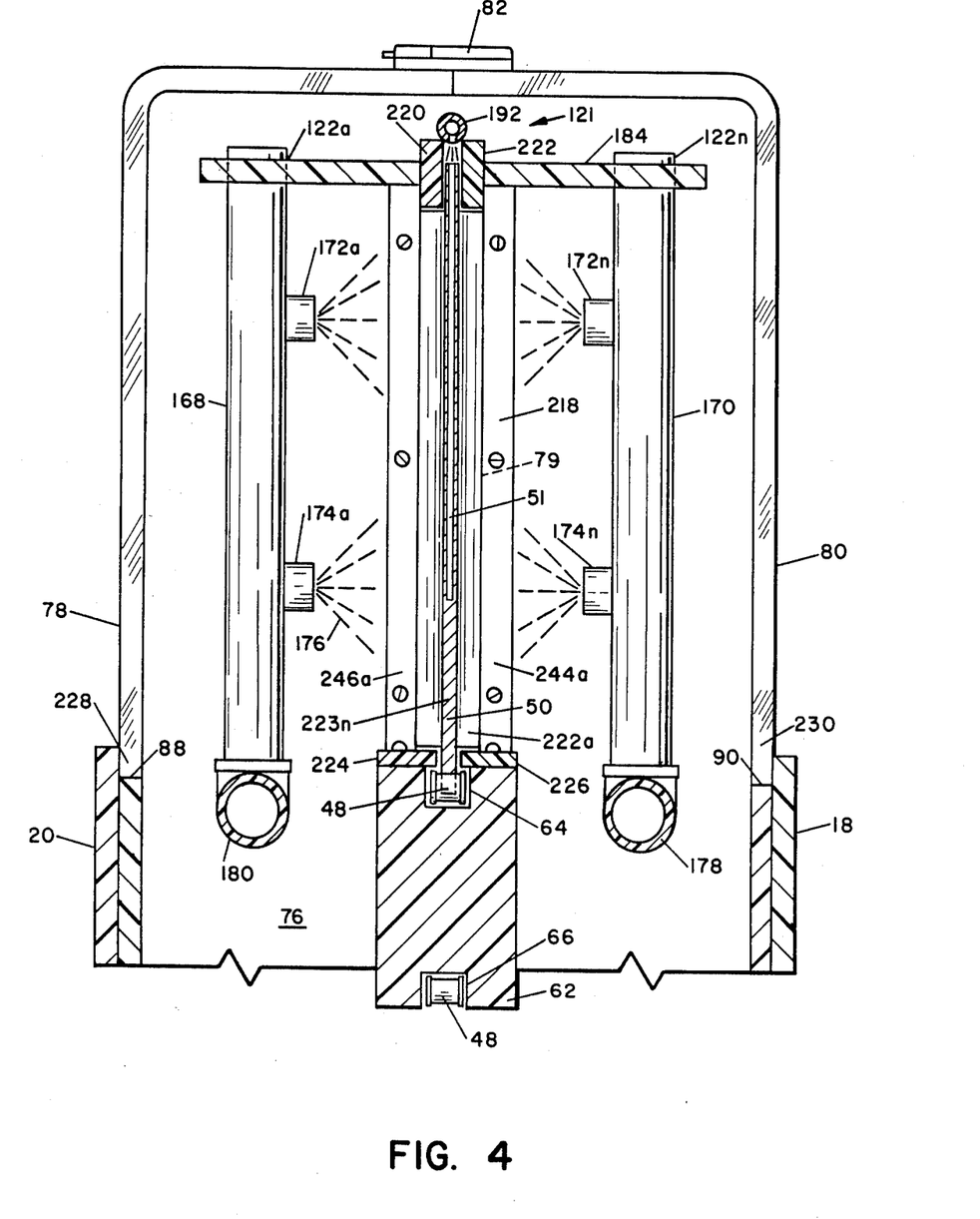
FIG. 4 illustrates a typical cross section taken along line 4—4 of FIG. 3 of the rinse chamber which is also typical of the develop or wash chamber.

FIG. 1 illustrates a perspective view of a vertical photoresist developer 10, as also illustrated in FIGS. 2, 3, and 4. The developer includes a four-legged rectangular stand 12 with opposing ends 14 and 16, two opposing sides 18 and 20, bottom 22, and upper support member 24 engaging and fitting within ends 14, 16, sides 18 and 20, and resting upon the bottom 22 of the rectangular stand 12. A motor base 26 with an additional support leg 27 secures between four legs 28, 30, 32 and 34 of stand 12. A control relay rack 36 mounts adjacent to leg 28 of the stand 12, and above the rear portion of the motor base 26. A developer pump 38, also referred to as the wash pump, and an air blower 40, as well as other components, mount on motor base 26. The components are plumbed within upper body member 24 as discussed later in detail.

Figure 5:
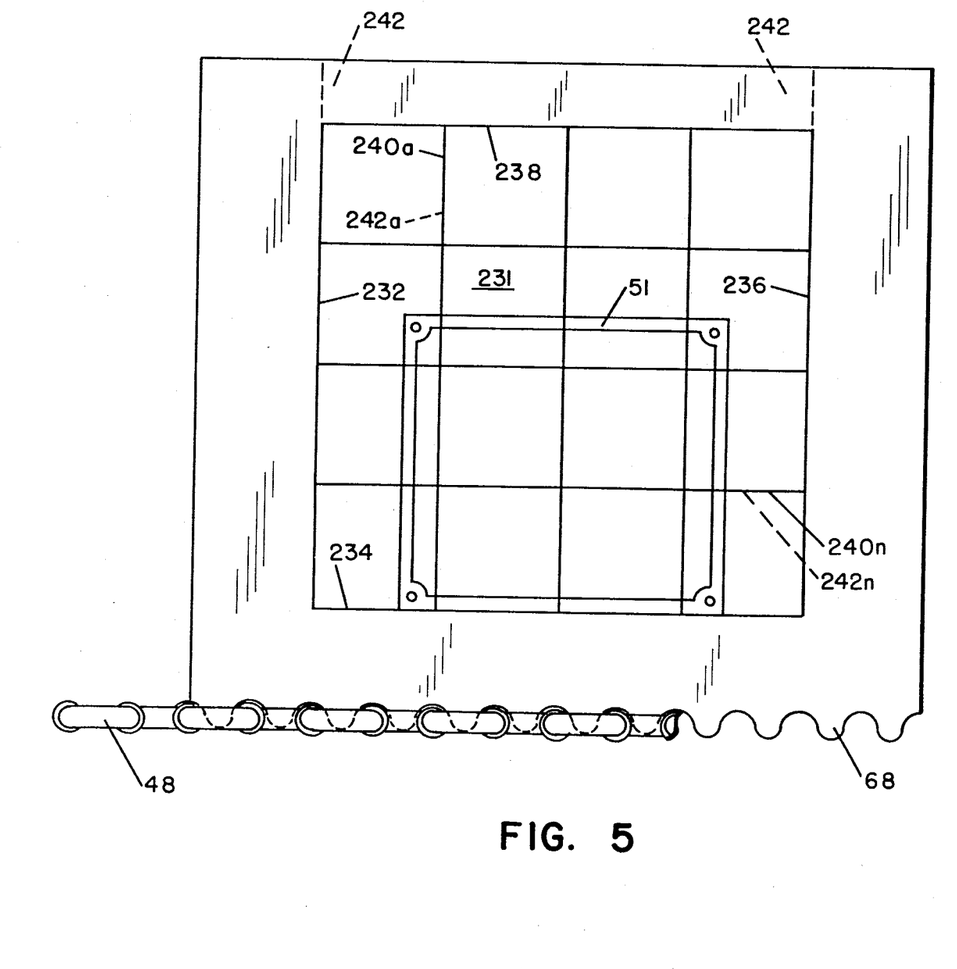
FIG. 5 illustrates a side view of a printed circuit board engaged within the toothed carrier.

Upper support member 24 (FIG. 2) includes developer chamber 42, also referred to as a wash chamber, a rinse chamber 44, and a drying chamber 46 through all of which a conveyor chain 48 carries a plurality of stainless steel or plastic processing cassettes 50a–50n. A variable speed conveyor drive motor 52 and intermediate drive chain 54, as depicted in FIGS. 2 and 3, drive a sprocket 56 and conveyor chain 48. An adjustable sprocket adjusting plate 58 positions adjust sprocket 60 to tighten and tension conveyor chain 48 properly. A chain guide 62 with longitudinal upper and lower slots 64 and 66 (FIG. 4) position and guide the chain between sprockets 56 and 60 through wash, rinse and dry chambers 42, 44, and 46, as also shown in FIGS. 2, 3, and 4. The processing cassette 50, as also shown in FIG. 5, utilizes a plurality of teeth 68 along the lower edge to engage links of the conveyor chain 48 for passage thereupon and through the chambers 43, 44, and 46. End walls 70 and 72, with vertical passage slots 73 and 75, position at the ends of the develop chamber 42 and drying chamber 46, respectively. Divider wall 74 with a vertical passage slot 77 positions between the develop chamber 42 and the rinse chamber 44, and divider wall 76 with a vent passage slot 79 positions between the rinse chamber 44 and the dryer chamber 46, as also shown in FIGS. 2 and 3.

A two-section transparent substantially U-shaped cover, as shown in FIGS. 2 and 4, including mirror like opposing sides 78 and 80 and a plurality of cover snaps 82 position over end seals 84 and 86 of FIG. 2 and side grooves 88 and 90 of FIG. 4 to provide a water and air tight seal over and about the chamber areas 42–46. Cassette loading slot 92 formed by slot walls 94 and 96 position at the front of the upper support member 24 for initial vertical alignment of the processing cassettes 50 for conveyance by chain 48 through the chambers 42–46. An unloading slot 98 at the rear of the upper support member 24 is similarly formed by slot walls 100 and 102. Load slot 92 and sprocket 56, shown also in FIGS. 2 and 3, are supported by end support member 104 which secures to the end wall 70. Unload slot 98, sprocket 56 and the variable speed drive motor 52 are supported by support member 106 which secures to end wall 72. Almost all panels, pipes, tubes, tanks, supports, and other elements are constructed of heavy wall plastic members to preclude corrosion or rusting by any chemical or other solutions used in the vertical photoresist developer.

FIG. 2 illustrates a right side view of the vertical photoresist developer where all numerals correspond to those elements previously described. In the wash chamber 42, a plurality of left and right develop, or wash tubes 108a–108n and 110a–110n, respectively, with upper and lower inwardly facing vertical spray pattern nozzles 112a–112n position and align upon the upper portion of left and right develop tubes 108a–108n and 110a–110n. Lower vertical spray pattern nozzles 114a–114n position on the lower portion of the left and right develop tubes 108a–108n and 110a–110n although more wash tubes can be utilized and this is not construed to be limiting or restrictive in the scope.

The right wash tubes 110a–110n and the left wash tubes 108a–108n are manifolded to themselves by right manifold 116 and left manifold 118 respectively. A planar support member 120 with a plurality of positioning holes 122a–122n fits between the end wall 70 and divider 74, and supports and positions the top ends of wash tubes 108a–108n and 110a–110n. A continuous upper cassette guide track 121 is positioned along support member 120 and along support members 184 and 204, and position between end walls 70 and 72. Left and right wash manifolds 116 and 118 are manifolded together by a cross manifold 124, and are fed wash or develop solutions 126 through pressure pipe system 128, adjustable pressure valve 130 and fluid pump 28 which recycles develop solution through fluid return pipe 132 and orifice 134 positioned at the bottom of rectangular fluid tank 136. Unions 138 and 140 are utilized for ease of maintenance of the pump system. A sump drain 142 is located at the tank bottom 136 for drainage of develop solution 126. A baffle 144 and drain scupper 146 positions in the bottom of wash chamber 42 to direct and drain develop fluid 126 into a removable screened particle filter box 148 for filtering of develop/wash fluid 126 prior to its return to the tank 136. A handled tank cover 149 positions over the tank for ready removal and servicing of filter box 148. Solution heater tube 150 and a solution temp/overheat sensor tube 152, both controlled by control panel 154, position below a junction box 156. Solution cooling loop 158, with a cooling water inlet solenoid valve 160 and cooling water outlet port 162 mount on end wall 70, within the confines of end support member 104, positions within tank 136 and is likewise controlled through control panel 154. Wash system pressure is sensed in pressure pipe system 128 and is transmitted to pressure gauge 164 of FIG. 1 by small pipe 166.

In rinse chamber 44, a plurality of left and right rinse tubes 168 and 170, respectively, with inwardly facing upper vertical spray pattern nozzles 172a–172n, position on the upper portion of rinse tubes 168a–168n and 170a–170n. Inwardly facing lower vertical spray pattern nozzles 174a–174n position on the lower portion of rinse tubes 168a–168n and 170a–170n, as also illustrated in FIG. 4, for rinsing by water 176 or other rinse solution or develop solution 126 from the cassette 50 and printed circuit board 52 as such pass through rinse chamber 44 although more rinse tubes can be used. The right rinse tubes 170a–170n and the left rinse tubes 168a–168n are manifolded to themselves by right and left rinse manifolds 178 and 180, respectively. Left and right rinse manifolds 178 and 180 are connected together by cross manifold 182. A planar support member 184 with a plurality of positioning holes 186a-186n fits between divider walls 74 and 76, and support and position the upper ends of rinse tubes 168a-168n and 170a-170n. The continuous cassette top guide track 121 is positioned along planar support member 184 which is further described later in FIG. 4. The rinse tubes 168a-168n and 170a-170n are fed water 176 or other rinse solution from their respective manifolds 180 and 178, cross manifold 182, and rinse pipe 188 through inlet solenoid valve 190. The solenoid valve 190 being controlled through control panel 54. An overhead rinse tube 192, as also shown in FIG. 3, positions on top of the upper cassette guide track 121 to insure proper rinse action at the top portion of the cassette 50, and receives rinse water or solution from right rinse tube 170a and small pipe 194. Rinse water or solution 176 exits the rinse chamber 44 through drain orifice 196 to a common drain or external rinse container. A vent 198 is installed in the side of the rinse chamber 44 in order to draw off any undesired fumes or other vapors, and for venting to the outside.

Inwardly facing left and right air knife dryers 200 and 202 position in drying chamber 46 to force air at a high velocity over the cassette 50 and printed circuit board 52 as such pass through the drying chamber 46. A planar support member 204 fits between divider 76 and end wall 72 for support and alignment of the upper regions of air knife dryers 200 and 202, and also as support for the upper cassette guide track 121. Both air knife dryers 200 and 202 are pressurized through air dry tube 206, unions 208 and 210, dryer blower 40 and perforated air intake tube 212. A safety switch 211 interrupts all power to the conveyor motor 52, pump 38 and dryer blower 40, rinse solenoid valve 190 and conveyor motor 52 in the event the cover halves are not installed or are removed. An emergency stop switch 213 interrupts all power to the conveyor motor 52, the pump 38 and the air blower 40 and the rinse solenoid valve 190 should an individual desire to halt operation of the photoresist developer for whatever reason.

FIG. 3 illustrates a top view of the vertical photoresist developer with tube and dryer top supports 120, 184 and 204 and cover halves 78 and 80 removed, where all numerals correspond to those elements previously described. Particularly noted is the conveyor chain 48 within the chain guide 62 running the full length of the upper body member 24. Also shown is the placement of chamber divider seals 214, 216, and 218, which are further illustrated in detail in FIGS. 4 and 6. Also shown is the overhead rinse tube 192, as well as other previously described components within chambers 42-46.

FIG. 4 illustrates a typical cross section taken along line 4—4 of FIG. 3 of the rinse chamber 44 which is also typical of the develop/wash chamber 42, where all numerals correspond to those elements previously described. Shown in particular is the upper cassette guide track 121 with two vertically aligned opposing members 220 and 222 which position longitudinally between end walls 70 and 72, and through chambers 42-46 for guidance of the top portion of a cassette 50 through the chambers. Teeth 68 are engaged within conveyor chain 48 for passage of the cassette 50 through chambers 42-46. Chamber divider seal 218 is shown mounted over and about the vertical slot 79 with its plurality of opposing flexible mylar wiper gaskets 222a and 223a for complete separation of the chambers during the time the cassette 50 moves from one chamber to another, and also when the cassette has passed completely through all cycles and the machine has not yet been deactivated. Upper chain guide horizontally aligned members 224 and 226 are affixed upon the chain guide 62 with appropriate hardware for initial alignment and centering of the cassette 50 within the conveyor chain 48. The lower ends 228 and 230 of cover halves 78 and 80 engage within slots 88 and 90, and against end wall gaskets 84 and 86 affecting a water proof seal of the chambers 42-46. Positioning of the rinse tubes 168 and 170 is shown with reference to the planar support member 184 and the chain guide 62. Planar member 184 is positioned between divider wall 76 and divider wall 74. Develop tubes 108a-108n and 110a-110n in chamber 42 are similarly positioned.

FIG. 5 illustrates a side view of a printed circuit board 51 engaged within the toothed stainless steel or plastic cassette carrier 50 where all numerals correspond to those previously described. An open pocket 231 is formed by interior edges 232, 234, 236 and 238, and horizontal and vertical monofilament plastic aligned cord pairs 240a-240n and 242a-242n, similar to fishing line, which are fixed vertically and horizontally across edges 232-238. The printed circuit board 51, to be processed, has access to the open pocket 231 through elongated slot 242 through edge 238. The printed circuit board 52 is removed from the carrier by simply inverting the cassette unit 50 so that the printed circuit board may slide from the open pocket 231 through the elongated slot 242. Shown in particular in this illustration is the fitting of the plurality of cassette teeth 68 into the links of the conveyor chain 48, each of which can be fashioned of non-corrosive stainless steel or high tensile plastic.

Figure 6:
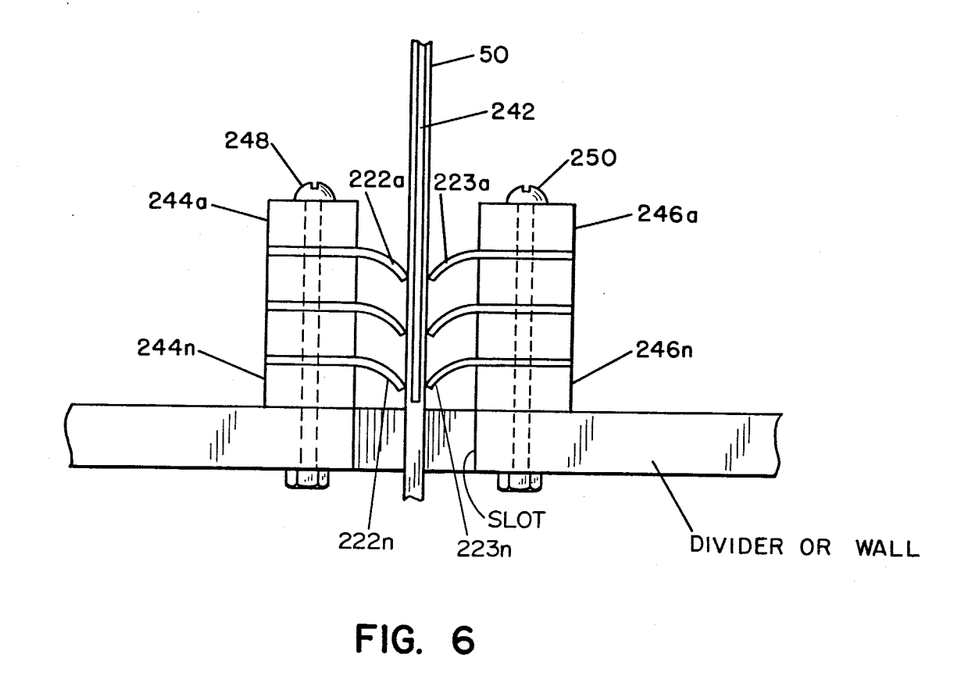
FIG. 6 illustrates a top view of the chamber divider seal.

FIG. 6 illustrates a top view of the chamber divider seal where all numerals correspond to those previously described. Pairs of flexible mylar wiper gasket seals 222a-222n and 223a-223n position between a plurality of separation blocks 244a-244n and 246a-246n, respectively, in stacked fashion and secure adjacent and over a vertical divider or end wall slot area by the use of nut and bolt assemblies 248 and 250. The flexible mylar wiper gaskets seals 222a-222n and 223a-223n overlap when a cassette is not passing through the slot and form a seal between any two chambers during cassette passage, as well as a wiping and sealing action as the cassette passes from chamber to chamber or from the loading end 92 into wash chamber 42.

Figure 7A:
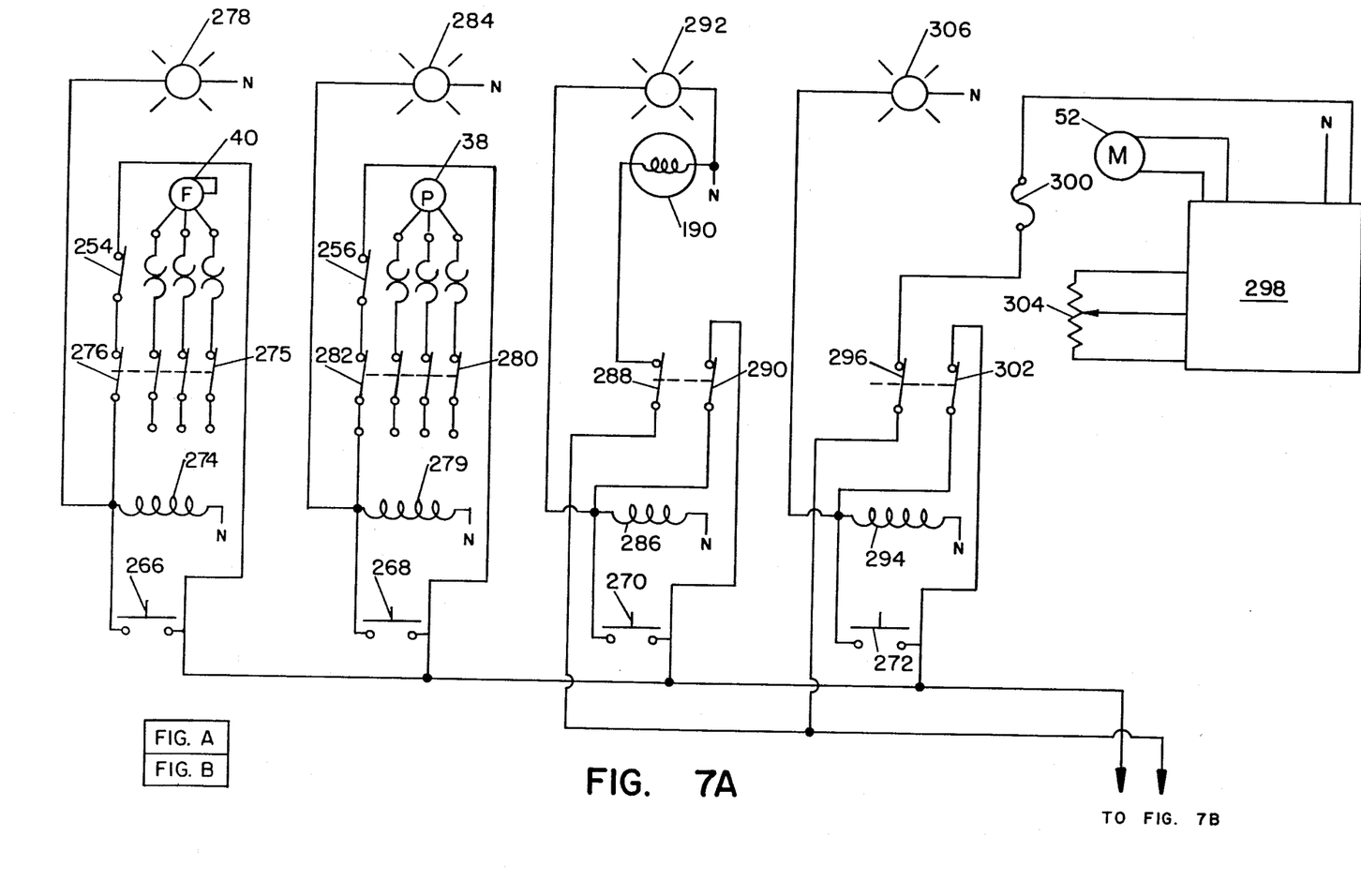
FIGS. 7A and 7B, with appropriate matched lines, illustrate the electrical control schematic for the vertical photoresist developer; and, FIG. 8 illustrates the control panel for the vertical photoresist developer.
Figure 7B:
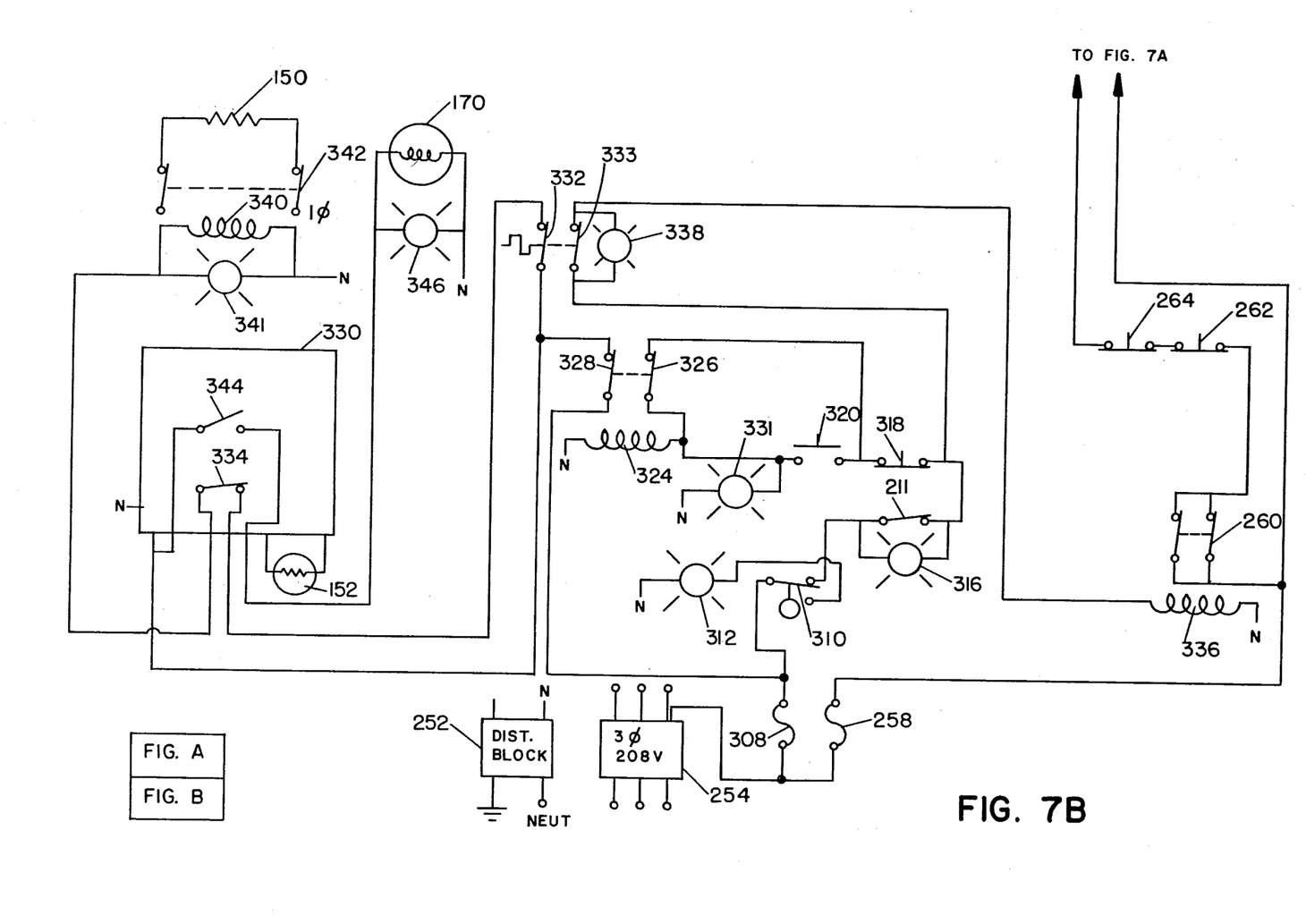

FIGS. 7A and 7B, with matched lines, illustrate the electrical control schematic for vertical photoresist developer.

FIG. 7A illustrates the electrical control schematic for the conveyor, rinse, wash and dry functions, and FIG. 7B illustrates the temperature control and emergency control electrical systems schematic. Single phase AC tapped from a three-phase distribution bus 254, using distributor block 242 for neutral and ground voltages and motor speed control, is used for control power of various relays, while a three-phase AC distribution bus 254 powers high load items as the dryer blower 40 and the wash pump 38 which are afforded circuit protection through circuit overload contactors 254 and 256. The circuits are shown in full and normal operating condition with tank heat being powered. Combination push switches with independently wired corresponding annunciator lights are used on control panel 154. Power to elements in FIG. 7A is supplied through a fuse 258, interlock relay contacts 260, external emergency stop switch 262, which is in series with stop switch 264, to start switches 266, 268, 270 and 272. Start switch 266 energizes the dryer blower holding coil 274. The dryer blower multiple relay power contacts 275 apply power to the dryer blower 40, and the blower relay holding contacts 276. An annunciator light 278 indicates energizing of the blower relay coil 274 and hence operation of the dryer blower 40. Start switch 268 energizes the pump holding coil 278. Pump relay multiple power contacts 280 apply power to the pump 381, and the pump relay holding contacts 282. An annunciator light 284 indicates energizing of the pump relay coil 279 and home operation of the pump 38. Start switch 270 energizes the rinse holding coil 286. The rinse solenoid relay power contacts 288 apply power directly from the fuse 258 line to the rinse valve solenoid 190, and the rinse solenoid holding contacts 290. An annunciator light 292 indicates energizing of the rinse relay coil 286 and hence operation of the rinse solenoid valve 190. Start switch 272 energizes the conveyor holding coil 294. The conveyor relay power contacts 296 apply power to the motor speed control 298 directly from the fused 268 line through fuse 300, and to the conveyor motor holding contact 302. A speed control adjustment potentiometer 304 controls the speed of the conveyor motor 52 through speed control 298. An annunciator light 306 indicates energizing of the conveyor power relay coil 294 and hence operation of the conveyor motor 52. Actuation of normally closed switch 264 or the control panel 154 or the normally closed emergency stop button 262 located on the side of the end support member 106, or the opening of the interlock relay contacts 260, will cease operation of fan blower 40, pump 38, rinse solenoid 190 and conveyor motor 52 due to interruption of actuating power to respective relay coils 274, 279, 286, and 294.

FIG. 7B illustrates the temperature control and emergency control electrical schematics. Single phase AC power powers the system through a fuse 308, a low level switch 310 and accompanying low level annunciator light 312, a cover open switch 211 and accompanying cover open annunciator light 316, temperature control off switch 318 and temperature control on switch 320 with accompanying temperature control on annunciator light 331. Temperature control on switch 320 activates the temperature control holding coil 324, the temperature control holding contacts 326 and the temperature control relay power contacts 328 which delivers power to the temperature controller 330 through temperature control power contacts 328 and also delivers power through over temperature sensing contacts 332. Contacts 332 will open in case of an over temperature thus removing power to the heat relay contacts 334 of temperature control 330 and removing power through over temperature sense contacts 333, to the interlock holding relay coil 336 to interrupt power to relay coils 274, 279, 286, and 294, ceasing operation of the dry blower 40, pump 38, rinse solenoid 190 and conveyor motor 52. An over temperature annunciator light 338 illuminates when the over temperature sensor contacts 332 and 333 are opened. The opening of the low level switch contacts 310 or the cover open contacts 211 will also interrupt power to the interlock holding coil 336 thereby causing power to be interrupted to the dryer blower 40, pump 38, solenoid valve 190 and the conveyor motor 52, and also turning off power to the temperature controller 330 and its associated components through deactivation of temperature control holding coil 324 and temperature control relay power contacts 328. The heat relay 334 in temperature controller 330 applies power to the heater rod element relay coil 340 for actuation of the heater element rod 150 through heater rod power contacts 342, and also illuminates the heater annunciator light 341 when the tank sensor 152 inputs the temperature controller 330 to call for a develop solution 126 temperature increase. When develop solution 126 cooling is called for, tank sensor 152 inputs the temperature controller 330 to close cooling relay 344 applying power to the cooling water solenoid valve 190 and illuminating the cooling annunciator light 346. The interlock holding relay contacts cannot be actuated, unless the low level switch 310 is closed, the cover is on and the cover switch 211 is closed and the over temperature control contacts 332 are closed thus providing for safe operation and proper action.

Figure 8:
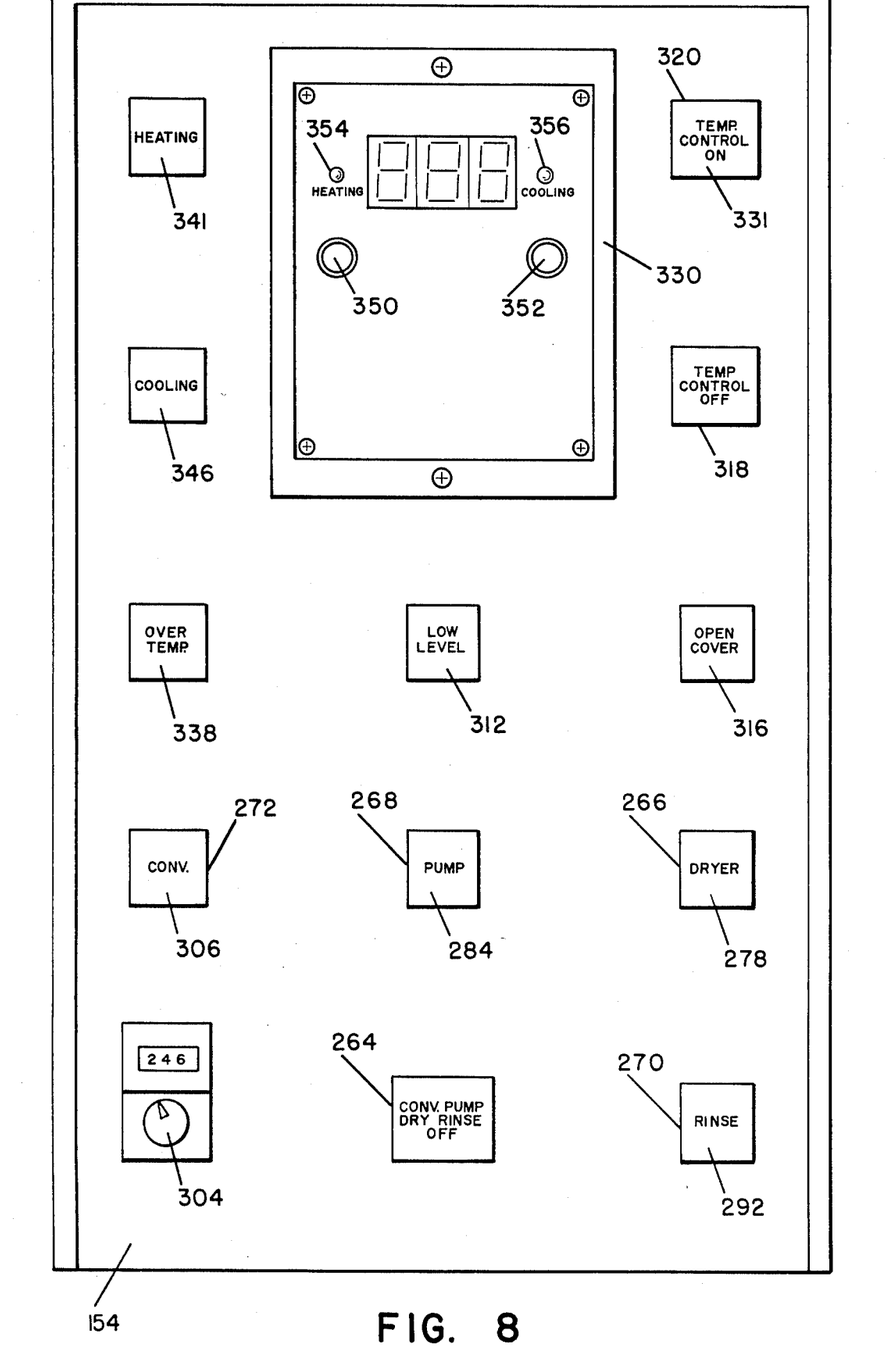

FIG. 8 illustrates the control panel face illustration. In particular, the digital temperature control 348 readout and temperature set controls 350 and 352, and temperature control internal LED annunciators 354 for cooling and 356 for heating are illustrated. All other numerals correspond to those elements previously described.

MODE OF OPERATION

FIG. 2 illustrates the vertical photoresist developer 10, the present invention, as one figure setting forth operation of the present invention. The processing cassette 50 with a printed circuit board 51 contained therein, passes through the developer/wash chamber 42, rinsing chamber 44 and drying chamber 46. The cassette 50 engages and fits within the open pocket 231 of cassette 50. The teeth 68 of the cassette 50 engage within the conveyor chain 48 links when the cassette is loaded in loading slot 92. The variable-speed drive motor 52 drives the endless conveyor chain 48 and the cassette 50 engaged therein with the board through the load slot 48, developer/wash chamber 42, rinse chamber 44, drying chamber 46, to the unload slot 98. Dual-nozzle vertically-stationed opposing wash tubes 108a–108n and 110a–110n spray chemical processing solution 126 flow upon both sides of the cassette 50 and circuit board 51 as passed within develop/wash chamber 42. Pump 38 provides for pressurization of the processing solution 126 through pressure pipe 128 and through manifolds 116 and 118 for spraying from vertically aligned wash tubes 108a–108n and 110a–110n. A temperature and overheat sensor 152 positions in the tank 136 to monitor develop solution 126 temperature for subsequent automatically applied heating or cooling through heater tube element 150 or cooling loop 158, respectively, as controlled by a digital temperature controller 330 and associated components in control panel 154 as described, although the use of any other type of temperature controller may be utilized. The developer/wash chamber 42 is sealed from the load slot 92 and the rinse chamber 44 by seal 214, and from the rinse chamber 44 by seal 216, which positions about vertical slots 73 and 77. As the cassette 50 with contents pass into the rinse chamber 44, water or other rinse solution 176 is sprayed upon both sides of the cassette and the board by dual opposing rinse spray nozzles 168a–168n and 170a–170n. A top rinse spray nozzle 192 fixed over the top of the upper track guide 121 sprays the cassette 50 and the board from above for complete rinse spraying. Rinse solution 176 enters through inlet solenoid valve 190 and exits through drain 196 located at the bottom of rinse chamber 44. Rinse chamber 44 is sealed on both ends by seals 216 and 218 located on divider walls 74 and 76, respectively. After passing through rinse chamber 44, the cassette and board traverses through dryer chamber 46. Dryer blower 40 provides high pressure air to vertically aligned opposing air knives 200 and 202 for air blasting and drying of the cassette 50 and the board. After drying, the cassette enters the unload slot 98 where the board and cassette can be removed by operating personnel. Activation of the conveyor switch 272, pump switch 268, dryer switch 266, and rinse swtich 270, as illustrated in FIG. 8, will turn on each unit individually. Activation of switch 264, labeled "CONV. PUMP DRY RINSE OFF", or emergency shutoff switch 262 will turn off the conveyor motor 52, rinse solenoid 292, pump 38 and dryer blower 40 simultaneously. Activation of the "TEMP CONTROL OFF" switch 318 on the front panel will remove power to the temperature control 330, heater element 150, and cooling solenoid 190. Annunciator warnings of an "OVERTEMP" annunciator 338, "LOW LEVEL" annunciator 312, or the "OPEN COVER" annunciator 316, which are activated by overtemp contacts 333, low level contacts 310 or cover open contacts 316, respectively, indicate total shut down of the system including those controlled by the "TEMP ON" switch 320 and "CONV. PUMP DRY RINSE OFF" switch 264, including all temperature sensing and regulating functions, motor, blower or spraying functions. The cover open contacts 316 in the open position provide for operator protection should an individual start any functions without the cover in its proper position.

Various modifications can be made to the present invention without departing from the apparent scope thereof.

We claim:

1. Printed circuit board chemical processing system comprising:
   a. inlet chamber;
   b. main chamber including a liquid sump;
   c. rinse chamber;
   d. drying chamber;
   e. outlet chamber;
   f. an endless chain extending through said chambers, and housing means supporting said chambers and for carrying at least one processing cassette;
   g. substantially horizontally positioned fluid dispensing nozzles in said main, rinse, and drying chambers and means for electromechanically controlling the flow of fluid therethrough;
   h. abutting pairs of vertically disposed flexible seal means between said main, rinse, and drying chambers to allow passage of said processing cassette with said board and prevent comingling of fluids used in respective chambers of said system; and,
   i. at least one cassette having a plurality of teeth disposed along a lower side thereof for engagement with said driving chain and having a vertical pocket therein for accepting printed circuit boards of variable size and positioning said boards substantially parallel to the path of movement of said chain for movement between said nozzles and processing through each of said chambers, said pocket in said cassette defined by interior opposing edges of an exterior wall of said cassette, and a plurality of cord means extending between exterior walls of said cassette for retaining said board whereby the fluid from said nozzles flows substantially horizontally to impinge against the planar surfaces of said boards.

2. System of claim 1 wherein said main chamber includes a plurality of symmetrically opposed aligned spray tubes.

3. System of claim 1 wherein said rinse chamber includes a plurality of symmetrically opposed aligned spray tubes.

4. System of claim 1 wherein said drying chamber includes means for air flow.

5. System of claim 1 including control means for regulating fluid temperature and for regulating fluid flow through said chambers.

6. System of claim 5 including means to measure temperature of said fluid and visual readout means connected to said measuring means.

7. System of claim 5 including warning means for low fluid level and low temperature level of fluid.

8. System of claim 5 wherein said control means is mounted on a lower portion of said housing means.

9. System of claim 5 inlcuding means for filtering said fluid.

10. System of claim 1 further including air knife drying means positioned within said drying chamber.

* * * * *